United States Patent [19]

Kameyama

[11] Patent Number: 4,910,572
[45] Date of Patent: Mar. 20, 1990

[54] SEMICONDUCTOR DEVICE AND METHOD OF FABRICATING THE SAME

[75] Inventor: Shuichi Kameyama, Itami, Japan

[73] Assignee: Matsushita Electric Industrial Co., Ltd., Osaka, Japan

[21] Appl. No.: 886,663

[22] Filed: Jul. 16, 1986

[30] Foreign Application Priority Data

Jul. 19, 1985 [JP] Japan ................. 60-160514

[51] Int. Cl.$^4$ ............................. H01L 29/48
[52] U.S. Cl. ........................... 357/34; 29/576;
29/580; 148/1.5; 357/50; 357/59; 428/156;
428/161; 428/195; 428/212; 436/67; 436/90;
436/203
[58] Field of Search ............. 428/212, 156, 161, 195;
148/D11, D10, D20, D122, D85, 1.5; 29/576
B, 576 E, 576 W, 580; 357/34, 50, 59;
437/31-34

[56] References Cited

U.S. PATENT DOCUMENTS

| | | | |
|---|---|---|---|
| 3,913,124 | 10/1975 | Roberson | 357/50 |
| 3,956,033 | 5/1976 | Roberson | 357/40 |
| 4,128,845 | 12/1978 | Sakai | 357/34 |
| 4,190,949 | 3/1980 | Ikeda et al. | 357/34 |
| 4,236,164 | 11/1980 | Tang et al. | 357/34 |
| 4,243,435 | 1/1981 | Barile et al. | 357/34 |
| 4,318,751 | 3/1982 | Horng | 357/20 |
| 4,320,411 | 3/1982 | Fukushima | 357/50 |
| 4,367,509 | 1/1983 | Snyder et al. | 357/34 |
| 4,471,525 | 9/1984 | Sasaki | 29/576 W |
| 4,498,227 | 2/1985 | Howell et al. | 357/34 |
| 4,573,064 | 2/1986 | McLevige et al. | 357/34 |
| 4,615,104 | 10/1986 | Kameyama et al. | 29/576 W |
| 4,663,631 | 5/1987 | Birrittella et al. | 357/50 |

FOREIGN PATENT DOCUMENTS 0154282 12/1979 Japan ........................ 357/50

OTHER PUBLICATIONS

Rung et al., "A Retrograde p-Well for Higher CMOS", IEEE Transactions on Electron Devices, vol. ED-28, No. 10, Oct. 1981, pp. 1115–1119.

Combs, "Scaleable Retrograde P-Well CMOS Technology", IEDM 81, pp. 346–349.

Stolmeijer, "A Twin-Well CMOS Process Employing High-Energy Ion Implantation", IEEE Transactions on Electron Devices, vol. ED-33, No. 4, Apr. 1986, pp. 450–457.

Primary Examiner—Marion C. McCamish
Attorney, Agent, or Firm—Wenderoth, Lind & Ponack

[57] ABSTRACT

A semiconductor device and a method of making a semiconductor device including a semiconductor substrate of p-type conductivity, a first semiconductor region of n$^+$-type conductivity selectively formed on the semiconductor substrate, a second semiconductor region of n-type conductivity formed insularly contacting on the first semiconductor region, a groove extending from a surface of the second semiconductor region spaced from the first semiconductor region to the vicinity of a surface of the first semiconductor region abutting the second semiconductor region, a conductive material charged into the groove, and a third semiconductor region of high impurity n-type conductivity disposed so as to connect a bottom of the groove with the surface of the first semiconductor region, whereby the conductive material in the groove and the third semiconductor region are used as low resistance current paths reaching from the surface of the second semiconductor region to the first semiconductor region.

13 Claims, 6 Drawing Sheets

SEMICONDUCTOR DEVICE AND METHOD OF FABRICATING THE SAME

BACKGROUND OF THE INVENTION

This invention relates to a semiconductor device and method of fabricating the same, and more particularly to a semiconductor device having fine and low-resistance current paths flowing in element regions of a bipolar integrated circuit element, an FET integrated circuit element or the like and method of fabricating the same.

Recently, in the field of semiconductor devices, in particular, semiconductor integrated circuit devices, fine processing technology has been introduced to cope with the higher density, lower power consumption, and higher speed of these devices. To realize high speed in a bipolar NPN transistor, for example, it is necessary to lower the parasitic resistance of each junction, aside from decreasing the parasitic capacity of an element by using shallow and fine junctions or decreasing the element isolation capacity by using dielectric isolation. With CMOS or other transistors, as in bipolar elements, it is required to decrease the parasitic resistance among junctions in order to prevent the latch-up phenomenon, as well as to form fine junctions and improve the element isolation. For example, in the bottom of an n-type low impurity concentration well of a CMOS, an n-type element region of high impurity concentration is formed by high energy ion-implantation, or a buried layer region of high impurity concentration is formed in the bottom of a well when developing a substrate by epitaxial growth, in attempts to decrease the parasitic resistance among junctions.

For this reduction of resistance, in conventional semiconductor devices, a buried low resistance semiconductor region having high impurity concentration was formed beneath the insular element region. As the method of taking out an electric current from this low resistance semiconductor region into the surface of semiconductor, the semiconductor region having a high concentration of impurity deeply diffused from the semiconductor surface is connected to the buried low resistance semiconductor region, and this semiconductor region formed by deep diffusion is utilized as a current path. For example, as mentioned in Symposium on VLSI Technology Digest of Technical Papers, pp. 42–43, a groove to isolate the NPN transistor region in an insular form is formed in a width of about $2\mu$ and a depth of about $5\mu$, and this groove is filled up with polycrystalline silicon to flatten the surface. Beneath the n-type epitaxial layer which becomes part of the insular element region, a low resistance buried semiconductor region (sub-collector) having an n-type high concentration impurity is formed. Contacting with this sub-collector, an n-type deep low resistance semiconductor region is formed, and the collector electrode is connected in this region. The two low resistance regions with which the sub-collector region and deep low resistance region contact serve as low resistance current paths of the collector current flowing between the emitter electrode and collector electrode. The deep low resistance semiconductor region is formed by diffusion from the surface of epitaxial semiconductor layer, and has a depth of about 1 to $2\mu$. The following points may be picked up as the problems, in both structure and manufacturing process, of this low resistance semiconductor region.

(1) When forming a low resistance region by the diffusion method, the lateral diffusion (yi) spreads about 70% of the depth in the longitudinal direction (xj), and the width of the low resistance region substantially increases, and a large dimensional change occurs with respect to the diffusion opening of the mask design, and this lateral diffusion is contrary to the micronization of elements.

(2) When forming a low resistance region by the diffusion method, since high temperature is required for a long period for diffusion, this region cannot be formed after shallow diffusion for forming a base region or the like. Besides, since the impurity profile in the sub-collector region is easily broken, it is difficult to obtain a steep impurity profile suited to high speed. That is, in the low temperature manufacturing process for forming a shallow junction for high speed, it is not preferable to form a deep region with low resistance.

(3) Due to the foregoing reason (1), unless the lateral diffusion is inhibited, the distance to the base region becomes shorter, and the electric junction tolerance tends to deteriorate.

(4) When the n-type impurity concentration is high on the surface of the low resistance region, stress is likely to occur in single crystals of the semiconductor layer, which may lead to crystal defects.

SUMMARY OF THE INVENTION

The present invention, therefore, has as its principal object the provision of a semiconductor device in which the path of a current flowing in the element region is lowered in resistance.

Another object of the invention is to provide a method of fabricating a semiconductor device which is capable of fabricating low resistance current paths easily.

These and other objects are accomplished by a semiconductor device comprising a semiconductor substrate of a first conductivity type, a first semiconductor region of high impurity concentration of a second conductivity type selectively formed in said semiconductor substrate, a second semiconductor region of low impurity concentration of the second conductivity type formed in an insular form contacting on said first semiconductor region, a groove opened from the surface of said second semiconductor region reaching up to the vicinity of the surface of said first semiconductor region, a conductive material used to fill up said groove, and a third semiconductor region of the second conductivity type disposed so as to connect the bottom of said groove with the surface of said first semiconductor region, whereby the conductive material in the groove and the third semiconductor region are used as low resistance current paths reaching from the surface of the second semiconductor region to the first semiconductor region.

In various embodiments, a groove is filled with an isolator for the element isolation formed in order to isolate the first and second semiconductor regions in insular forms. In contact with the side wall of said groove for isolation, another groove filled with conductive material is disposed, and these two grooves are formed in side-by-side relationship. Alternatively a insulating film is provided at the side wall of the groove filled with conductive material. The first semiconductor region and low resistance current path are respectively used as the sub-collector and collector current path of a vertical NPN bipolar transistor.

This invention also relates to a method of fabricating a semiconductor device characterized by a step of selectively forming a first semiconductor region of high impurity concentration of a second conductivity type in a semiconductor substrate of a first conductivity type, a step of insularly forming a second semiconductor region of low impurity concentration of the second conductivity type contacting on said first semiconductor region, a step of forming a groove which is opened from the surface of said second semiconductor region to reach up to the vicinity of the surface of said first semiconductor region, a step of filling said groove with conductive material, and a step of forming a third semiconductor region of the second conductivity type so as to connect the bottom of said groove with said first semiconductor region, whereby the conductive material placed in said groove and the third semiconductor region are used as low resistance current paths reaching from the surface of the second semiconductor region to the first semiconductor region.

According to the present invention as described herein, the following benefits, among others, are obtained:

(1) When an anisotropic etching method to the vertical direction such as reactive ion etching (RIE) is employed for etching the groove formed for making up a low resistance region to be filled with conductive material, etching in a lateral direction may be restricted with respect to the resist pattern by a photo mask process, so that dimensional change may be reduced.

(2) Since conductive material is charged by forming a groove, long and high temperature heat treatment is not needed. If, for example, polycrystalline silicon is used the conductive material, since the diffusion of impurities in the polycrystalline silicon is 10 to 100 times faster than diffusion in a single crystal, a low temperature process can be realized, and the sequence of this process may be freely exchanged.

(3) When diffusion from the side wall of groove is started from the conductive material such as polycrystalline silicon, shallow diffusion is possible, so that the distance to the base region may be longer. Furthermore, on the side wall of this groove, a silicon oxide film or the like may be selectively formed, and the electric durability to the base region or other area may be improved.

(4) Since the impurity concentration on the inner surface of the groove may be made uniform or lowered entirely, large stress is not caused in the single crystals, and crystal defects do not occur. In particular, when material having the same coefficient of thermal expansion as the single crystal semiconductor such as polycrystalline silicon is used as the conductive material, the stress occurring in single crystals during heat treatment can be absorbed by the polycrystalline silicon, and occurrence of defects due to heat treatment in manufacturing process can be controlled.

(5) For element isolation, when a first groove is formed and filled up with an insulator, a second groove to be filled up with conductive material may be integrally disposed on the side wall of this first groove, so that the size of the element region may be reduced, and a fine element can be formed. Moreover, the first groove for element isolation and the second groove for conductive material can be formed in self-alignment using only one mask, whereby the number of photo masks can be decreased, and the manufacturing yield may be enhanced.

While the novel features of the invention are set forth in the appended claims, the invention, both as to organization and content, will be better understood and appreciated, along with other objects and features thereof, from the following detailed description taken in conjunction with the drawings, in which:

DETAILED DESCRIPTION OF THE INVENTION

A semiconductor device of this invention and a method of its fabrication are described below with the aid of illustrations of several embodiments.

Figure 1:
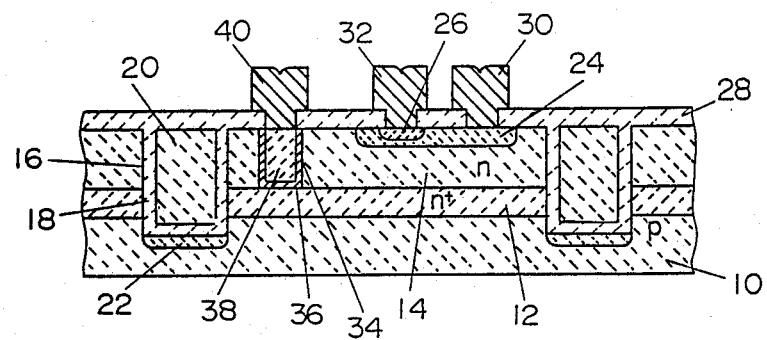
FIG. 1 is a sectional view of a bipolar NPN transistor in the first embodiment of this invention.

FIG. 1 is a sectional view showing an NPN transistor as a first embodiment of this invention. On a semiconductor substrate of first conductivity type comprising a p-type semiconductor substrate 10 and a first semiconductor region with high impurity concentration of second conductivity type comprising an $n^+$-type buried semiconductor layer 12 is formed, and a second semiconductor region with low impurity concentration of second conductivity type comprising an n-type epitaxial semiconductor layer 14 is formed on this layer 12. Said buried semiconductor layer 12 functions as the sub-collector or an NPN transistor, and the epitaxial semiconductor layer 14, as the collector. A first groove 16 is formed so as to penetrate through the epitaxial semiconductor layer 14 and buried semiconductor layer 12, and reach up to the upper part of the semiconductor substrate 10, and on the inner side wall of this groove 16 is formed a silicon oxide film 18, which is filled up with conductive material 20 such as polycrystalline silicon. A channel cut region 22 is provided in the bottom of the groove. This groove makes up an insulated isolation region for composing an insular region to form a semiconductor element. Inside of the thus formed insular region is formed a p-type semiconductor region 24 which functions as the base of the NPN transistor, and in this region 24 is formed an n-type semiconductor region 26 functioning as the emitter of the NPN transistor. On the surface of the epitaxial semiconductor layer 14, a silicon oxide film 28 is formed, except for the electrode forming area. In the base region 24, a base electrode 30 is connected, and an emitter electrode 32 is connected to the emitter region 26. In the collector region 14, a second groove 34 is formed, and this groove 34 is filled with a conductive material 38 such as polycrystalline silicon by way of an n-type high impurity concentration semiconductor region 36. A collector electrode 40 is connected to this conductive material 38. In this constitution, between the collector electrode 40 and emitter eletrode 32 are formed low resistance current paths by the conductive material 38, n-type high concentration semiconductor region 36, an n+-type buried semiconductor layer 12.

The method of fabrication of such a transistor as in the first embodiment of the invetion is described while referring to FIGS. 2 (a) to (d).

Figure 2A:
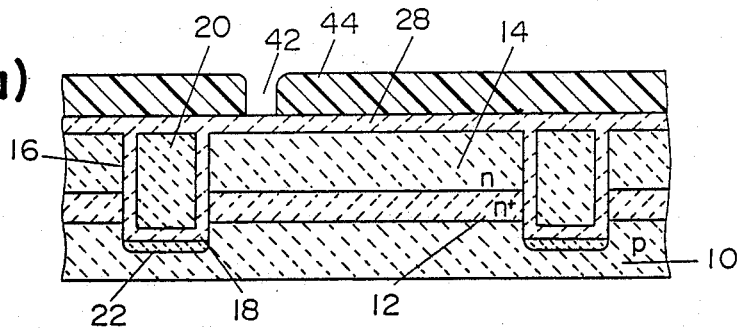
FIGS. 2 (a) to (d) are process sectional views to explain the method of fabricating the NPN transistor in the first embodiment of the invention.

(1) An n+-type buried layer 12 was formed on a p-type semiconductor substrate 10 as a first semiconductor region, and an n-type epitaxial semiconductor layer 14 was formed thereon as a second semiconductor region. A first groove 16 provided for isolation between elements was coated with silicon oxide film 18 of about 1500 Å, and was filled with polycrystalline silicon 20, and a p-type channel cut region 22 was formed in the bottom of this groove 16. On the surface of the semiconductor layer 14, a silicon oxide film 28 of about 5000 Å was formed, and a photo resist pattern 44 having an opening 42 in preparation for forming a groove to be filled with conductive material was formed on this film 28 by photoetching (FIG. 2a).

Figure 2B:
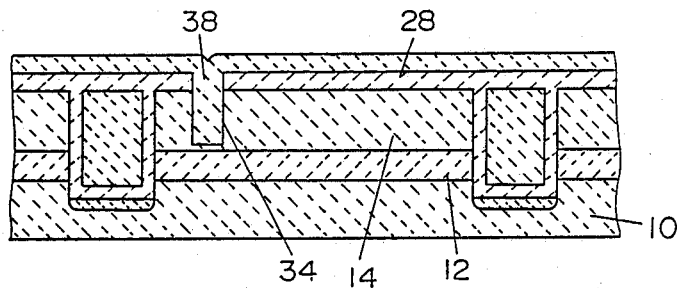

(2) Using the photo resist pattern 44 as the mask, the silicon oxide film 28 and the semiconductor layer 14 were sequentially etched by anisotropic etching such as RIE to form a second groove 34 extending to the vicinity of a surface of the buried layer 12 abutting the semiconductor layer 14, and polycrystalline silicon 38 was deposited on the entire surface in a thickness to fill up this groove (FIG. 2b).

Figure 2C:
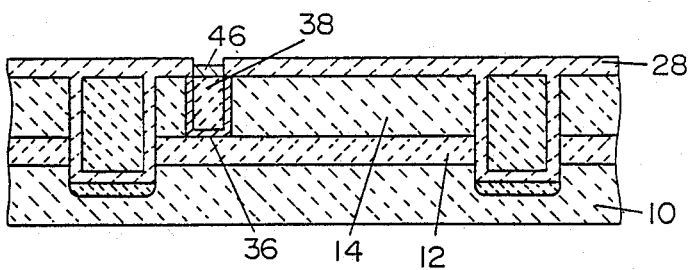
Figure 2C:
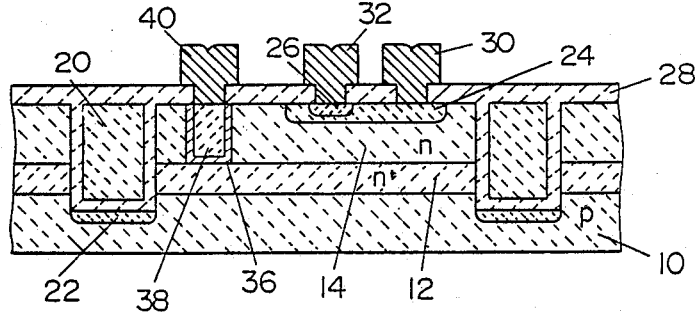

(3) Arsenic or other ions were implanted into the polycrystalline silicon 38, and the arsenic was diffused in the polycrystalline silicon 38 by a low temperature heat treatment to form an n-type high impurity concentration region 36 in the semiconductor layer 14 as a third semiconductor region, and the surface of the polycrystalline silicon 38 was etched, leaving the portion of polycrystalline silicon 38 to be used as a conductive material in the groove, and an oxide film 46 was formed on the surface of polycrystalline silicon 38 by thermal oxidation (FIG. 2c).

(4) According to the conventional method of fabricating an integrated circuit, a p-type semiconductor region 24 as the base, an n-type semiconductor region 26 as the emitter, a collector electrode 40, an emitter electrode 32, and a base electrode 30 were formed (FIG. 2d).

As the conductive material 38 used in this embodiment, a refractory metal or its silicide may be used. If ohmic contact is directly possible between such material and semiconductor single crystal, the n-type impurity concentration region 36 is not absolutely necessary. That is, when this groove is formed to the depth sufficient to reach the n+-type buried region 12, ohmic contact is directly possible with the conductive material. Meanwhile, since the electric resistivity in the n-type semiconductor region 36 on the side wall of groove 34 is smaller than that due to the impurities of the same concentration as in polycrystalline silicon, it is preferable to install the n-type semiconductor region on the side wall in order to set the resistance of the current path much lower. To form the n-type semiconductor region 36, it is not necessarily required to form it by diffusion from the conductive material 38, and, instead, it may be formed by ion implantation or another method by depositing the conductive material.

As a second embodiment of this invention, the fabrication method and construction of a bipolar NPN transistor are described below while referring to FIGS. 3 (a) to (c).

Figure 3A:
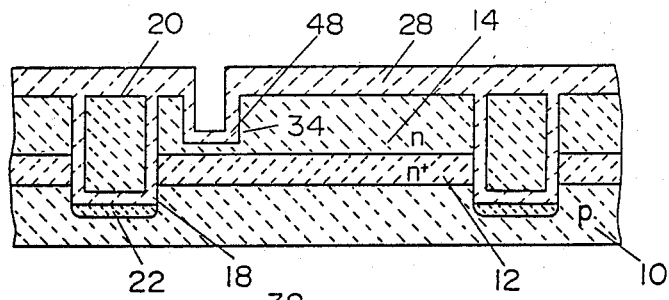
FIGS. 3 (a) to (c) are process sectional views to explain the method of fabricating the NPN transistor in a second embodiment of this invention.

(1) Similar to the first embodiment, a silicon oxide film 28 was patterned by a photo mask process, and a groove 34 was made by etching the silicon semiconductor layer 14. The surface of this groove was heated and oxidized to form a silicon oxide film 48 of about 1500 Å (FIG. 3a).

Figure 3B:
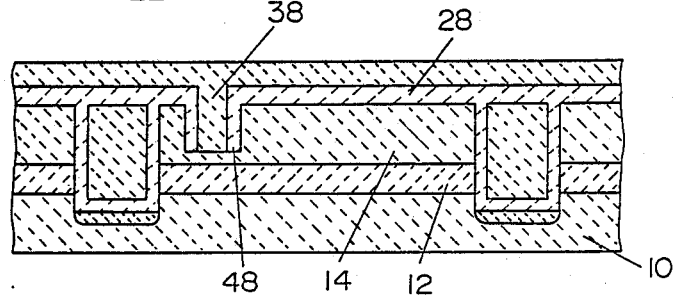

(2) The silicon oxide films 28, 48 were etched by anisotropic etching to the vertical direction such as RIE, and the surface of the semiconductor layer 14 was exposed in the bottom of the groove 34. The silicon oxide film 48 remained on the side wall of the groove 34, and polycrystalline silicon 38 was deposited on the entire surface in a thickness to fill up this groove 34 (FIG. 3b).

Figure 3C:
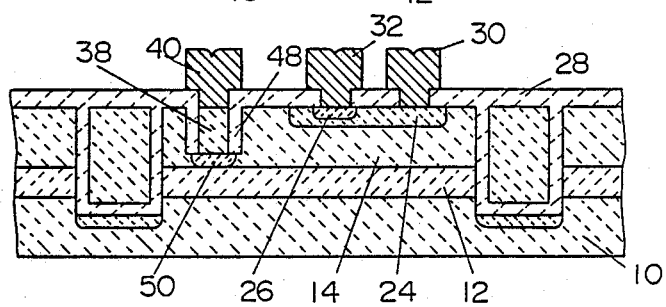

(3) Arsenic or other ions were implanted in the polycrystalline silicon 38, and an n-type semiconductor region 50 was formed in the bottom of the groove 34 by heat treatment. This region 50 was connected to the n+-type buried semiconductor region (sub-collector) 12, and the polycrystalline silicon 38 was etched, being left only in the groove 34. Furthermore, according to the conventional method of fabricating an of integrated circuit, a p-type semiconductor region 24 as the base, a n-type semiconductor region 26 as the emitter, a collector electrode 40, an emitter electrode 32, and a base electrode 30 were formed (FIG. 3c).

As one of the structural features of the NPN transistor of this second embodiment, an insulating film 48 is formed on the side wall of the groove 34 in which polycrystalline silicon 38 serving as conductive material is left over. As a result, the distance between the base 24 and the n-type high impurity concentration region 50 may be increased, or the base region 24 and silicon oxide film 48 may be brought into mutual contact, so that a so-called walled-base structure may be realized. Hence, the collector, base capacity may be reduced, and the size may be reduced on design, and the structure is suited to micronization.

As a third embodiment of this invention, the structure and manufacturing method on an NPN transistor are explained with the aid of FIGS. 4 (a) to (c).

Figure 4A:
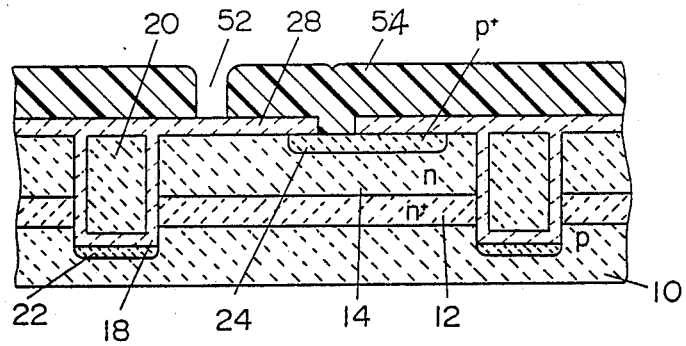
FIGS. 4 (a) to (c) are process sectional views to explain the method of fabricating the NPN transistor in a third embodiment of this invention.

(1) Similar to the first embodiment, after forming the substrate and element isolation region, boron or other ions were implanted to form a p-type semiconductor region 24 as a fourth semiconductor region serving as the base, and opening of the silicon oxide film 28 to be used as the emitter diffusion window on the base region was formed by a photo mask process. Further by a photo mask process, a photo resist pattern 54 having an opening 52 for forming a groove 34 to be filled with conductive material for collector was formed (FIG. 4a).

Figure 4B:
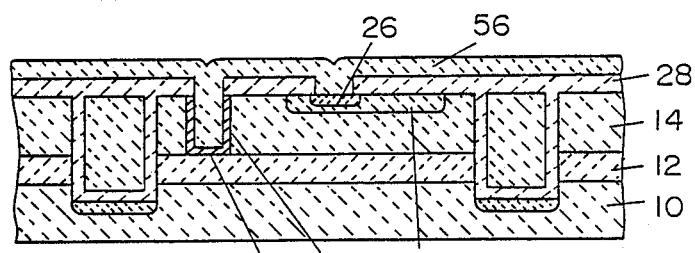

(2) Using the photo resist pattern 54 as the mask, the semiconductor layer 14 was etched to form a groove 34, and the photo resist pattern 54 was removed. Then, in a thickness to fill up the groove 34, polycrystalline silicon 56 was deposited on the entire surface. In this polycrystalline silicon 56, aresnic or other ions were implanted, and an n-type semiconductor region 26 serving as the emitter region, and n-type semiconductor regions 36 on the side wall and bottom of the groove were formed at the same time (FIG. 4b).

Figure 4C:
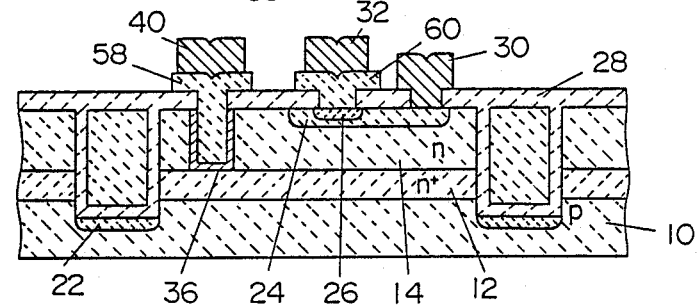

(3) According to the conventional method of fabricating an integrated circuit, the polycrystalline silicon was patterned, and polycrystalline silicon patterns 58, 60 were formed, and then collector electrode 40, emitter electrode 32, and base electrode 30 were formed (FIG. 4c).

An important feature of the fabricating method of the bipolar NPN transistor in this third embodiment is that the process has been simplified by forming the n-type semiconductor region 26 to become the emitter as a fifth semiconductor region and the n-type region 36 as a third semiconductor region simultaneously from the same conductive material 56, after forming the p-type semiconductor region 24 to become the base as a fourth semiconductor region, without so much changing the profile of the impurity region in the base region 24 by low temperature heat treatment.

As a fourth embodiment of this invention, the structure and fabricating method of a bipolar NPN transistor are shown by reference to FIGS. 5 (a) to (g).

Figure 5A:
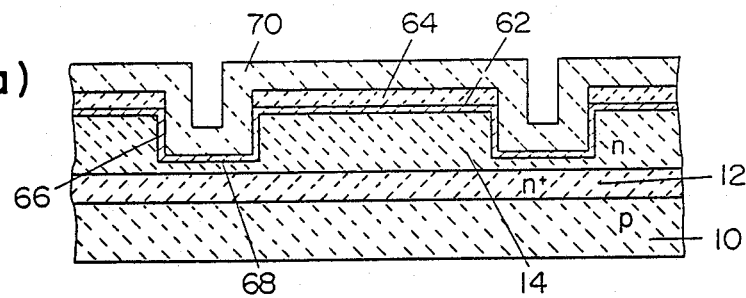
FIGS. 5 (a) to (g) are process sectional views to explain the method of fabricating the NPN transistor in a fourth embodiment of this invention.

(1) On a p-type semiconductor substrate 10, an n+-type buried region 12 as a first semiconductor region, an n-type epitaxial semiconductor region 14 as a second semiconductor region, a silicon oxide film 62 of about 500 Å, and a silicon nitride film 64 of about 2000 Å were formed. Afterwards, by a photo mask process, a first groove 66 of about 2.4μ in width was formed in the semiconductor layer 14 in the area to be used as an element isolation part, and a silicon oxide film 68 of about 1400 Å was formed in the groove 66 by thermal oxidation. Then, phospho-silicate glass (PSG) 70 of about 8000 Å was deposited on the entire surface (FIG. 5a).

Figure 5B:
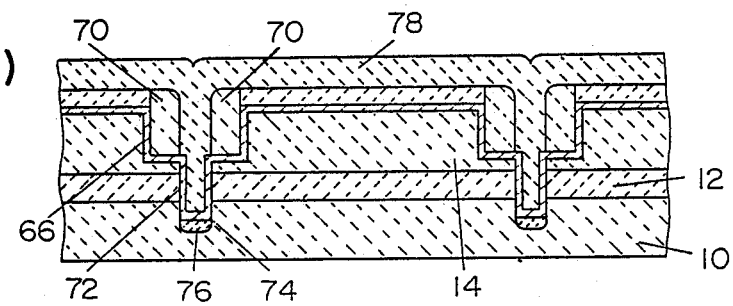

(2) By anisotropic etching such as RIE, the PSG film 70 was vertically etched to be left over only on the side wall of the first groove, and the silicon oxide film 68 exposed in the bottom of the groove 66 was etched open, and the surface of the semiconductor layer 14 was exposed to this opening. By etching such as RIE, a second groove 72 was formed in a width of about 8000 Å in the bottom of the groove 66, and a silicon oxide film 74 of about 1500 Å was formed on the surface of the second groove 72 by thermal oxidation. By implanting boron or other ions, a p-type semiconductor region 76 was formed in the bottom of the second groove 72 as a channel stopper. A polycrystalline silicon film 78 was deposited on the entire surface in a thickness of fill up the first and second grooves (FIG. 5b).

Figure 5C:
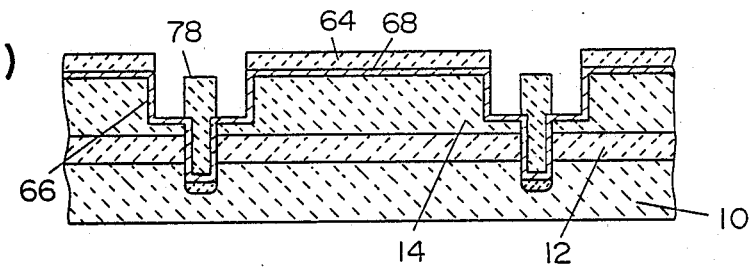

(3) The polycrystalline silicon 78 was flatly back-etched, and was left over in the first groove 66, and the PSG film 70 was selectively etched by diluted hyrogen fluoride (FIG. 5c).

Figure 5D:
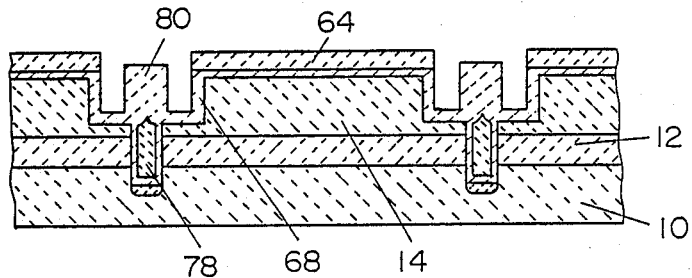

(4) The exposed surface of polycrystalline silicon 78 was oxidized by heating to form a silicon oxide film 80 (FIG. 5d).

Figure 5E:
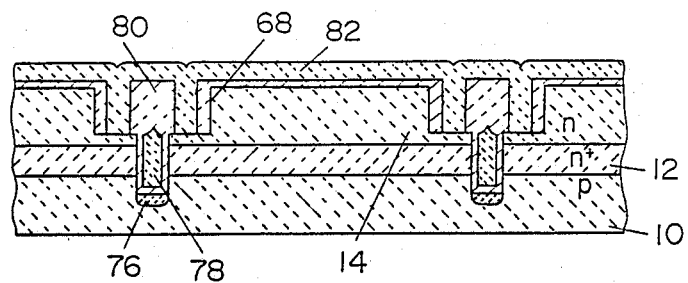

(5) By anisotropic etching such as RIE, the silicon oxide film 68 in the bottom of the first groove was selectively etched to expose the surface of semiconductor layer 14, and the silicon nitride film 64 was removed, then polycrystalline silicon 82 was deposited on the entire surface in a thickness to fill up the first groove (FIG. 5e).

Figure 5F:
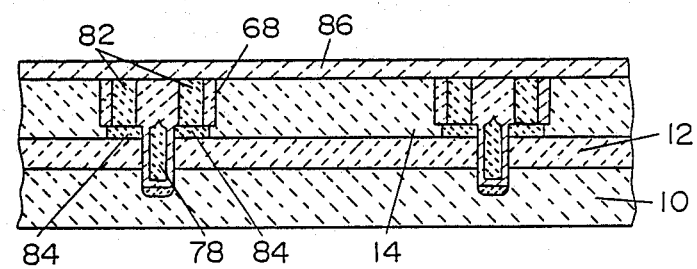

(6) Arsenic or other ions were implanted into the polycrystalline silicon 82, which was heated to form an n-type high impurity concentration region 84 as a third semiconductor region. The polycrystalline silicon 82 was flatly back-etched, and was left over in the groove, while the silicon oxide film 62 was etched and removed. Then silicon oxide film 86 of about 4000 Å was deposited on the entire surface (FIG. 5f).

Figure 5G:
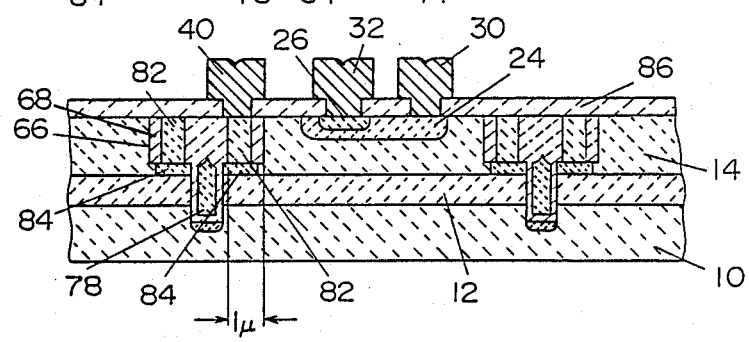

(7) According to the conventional method of fabricating an integrated circuit, a p-type fourth semiconductor region 24 as the base and an n-type fifth semiconductor region 26 as the emitter were formed, and emitter electrode 32 and base electrode 30 were formed. Collector electrode 40 was connected to the polycrystalline silicon 82 as the conductive material (FIG. 5g).

The manufacturing and structural features of the bipolar NPN transistor in this fourth embodiment include, among others, the following.

Figure 6:
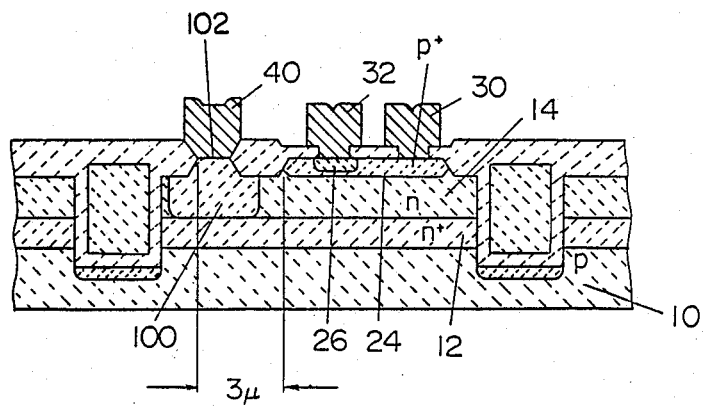
FIG. 6 is a sectional view of an NPN transistor presented by way of comparison.

(a) The polycrystalline silicon 82 as the conductive material for the collector and the silicon oxide film 80 as dielectric for element isolation are integrally formed, and the element isolation region can be reduced in size, so that the structure is suited to micronization. Yet, by increasing the thickness of the silicon oxide film 68 on the side wall of the polycrystalline silicon 82 to 5000 to 10000 Å and touching the base region 24 to this oxide film 68, the so-called walled base structure was realized easily, and a device of micro size and low power consumption was realized. Meanwhile, in the walled based structure, supposing the width of the portion having polycrystalline silicon 82 in the groove 66 to be about 5000 Å and the thickness of the silicon oxide film 68 to be about 5000 Å, the dimension of this portion becomes about 1.0μ as shown in the sketch. FIG. 6 shows a transistor fabricated by way of comparison, in which the collector electrode 40 is connected to the layer 12 by way of n-type diffusion region 100. In this diagram, supposing the diffusion window 102 to be 1.0μ, the lateral diffusion to be 1μ, and depletion layer width of the base region 24 to be about 1.0μ, the size of the n-type diffusion region 100 is totaled to 3μ. Therefore, in this invention, an improvement of about 2μ is obtained. This is a great dimensional improvement, as compared with the existing base diffusion region 24 being formed in a width of about 3μ, in the 1.0μ processing rule. Thus, a device of very small size and low power consumption was realized.

(b) The photo mask for forming an element isolation region and a mask for forming the groove for conductive material of the collector can be commonly used, and the number of photo masks is reduced, so that the manufacturing yield and cost may be improved.

Furthermore, aside from the method employed in this fourth embodiment, the following methods may be also usable. For example, the side wall of the first groove 66 which was nearly vertical in the illustrated embodiment may not be necessarily vertical, and it may be slightly tapered toward its bottom. Or the elements were isolated by forming the second groove 72, but, depending on the case, the pn-junction may be formed without forming the second groove 72, and it may be connected with the first groove 66 to isolate elements.

It is also possible to form the first groove 66 in a considerably wide area, and conductive materials for the collector or others may be left over preliminarily in its side wall, and inside the first groove 66 a silicon oxdie film to be selectively used later as an insulator may be formed by heat oxidation or depositing method. It it is not necessary to form the conductive material such as polycrystallne silicon on the whole circumference of the element region, when a part of the ring PSG films in FIG. 5b is selectively removed in the photo mask process, the conductive material 78 such as polycrystalline silicon may be left over only on the necessary portions.

While specific embodiments of the invention have been illustrated and described herein, it is realized that other modification and changes will occur to those skilled in the art. It is therefore to be understood that the appended claims are intended to cover all modifications and changes as fall within the true spirit and scope of the invention.

What is claimed is:

1. A semiconductor device comprising:
   a monocrystalline semiconductor substrate of first conductivity type;
   a first monocrystalline semiconductor region with high impurity concentration of second conductivity type selectively formed in said semiconductor substrate;
   a second monocrystalline semiconductor region with low impurity concentration of second conductivity type formed insularly contacting on said first semiconductor region;
   a groove extending from a surface of said second semicondutor region spaced from said first semiconductor region to the vicinity of a surface of said first semiconductor region abutting said second semiconductor region.

2. The semiconductor device of claim 1, wherein an insulating film is disposed on the side wall of said groove filled with conductive material and said third semiconductor region also abuts said polycrystalline conductive material.
   a polycrystalline conductive material charged into said groove;
   a third monocrystalline semiconductor region with high impurity concentration of second conductivity type disposed so as to connect a bottom of said groove with the surface of said first semiconductor region;
   an electrode connected to said conductive material, whereby said conductive material in said groove and said third semiconductor region are used as low resistance current paths from said electrode to said first semiconductor region; and
   a second groove for element isolation to isolate insularly said first and second semiconductor regions with said groove filled with conductive material, and said second groove being filled with isolating material, said third semiconductor region abutting said second semiconductor region.

3. The semiconductor device of claim 1, wherein said first and second semiconductor regions comprise a well of a CMOS transistor.

4. A semiconductor device comprising:
   a monocrystalline semiconductor substrate of first conductivity type;
   a first monocrystalline semiconductor region with high impurity concentration of second conductivity type selectively formed in said semiconductor substrate;
   a second monocrystalline semiconductor region with high impurity concentration of second conductivity type formed contacting on said first semiconductor region;
   a first groove extending from a surface of said second semiconductor region spaced from said first semiconductor region to the vicinity of a surface of said first semiconductor region abutting said second semiconductor region;
   a second groove for element isolation formed in order to isolate insularly said first and second semiconductor regions, said second groove being filled with isolating material;
   a polycrystalline conductive material charged into said first groove;
   a third monocrystalline semiconductor region with high impurity concentration of second conductivity type disposed so as to connect a bottom of said first groove with the surface of said first semiconductor region;
   an electrode connected to said conductive material,
   whereby said conductive material in said first groove and said third semiconductor region are used as low resistance current paths from said electrode to said first semiconductor region; and
   said first groove filled with conductive material being disposed in contact with a wall of said second groove for element isolation, said first and second grooves being in side-by-side relationship, and said third semiconductor region abutting said second semiconductor region.

5. A semiconductor device comprising:
   a monocrystalline semiconductor substrate of first conductivity type;
   a first monocrystalline semiconductor region with high impurity concentration of second conductivity type selectively formed in said semiconductor substrate;
   a second monocrystalline semiconductor region with low impurity concentration of second conductivity type formed insularly contacting on said first semiconductor region;
   a first groove extending from a surface of said second semiconductor region spaced from said first semiconductor region to the vicinity of a surface of said first semiconductor region abutting said second semiconductor region;
   a polycrystalline conductive material charged into said first groove to connect a bottom of said first groove with the surface of said first semiconductor region;
   an electrode connected to said conductive material,
   whereby said conductive material in said first groove is used as a low resistance current path from said electrode to said first semiconductor region; and
   said first and second semiconductor regions comprising a wall of a CMOS transistor, and said third semiconductor region abuts said second semiconductor region.

6. A method of fabricating a semicondutor device comprising the steps of:
   selectively forming a first monocrystalline semiconductor region with high impurity concentration of second conductivity type in a monocrystalline semiconductor substrate of first conductivity type;
   insularly forming a second monocrystalline semiconductor region with low impurity concentration of second conductivity type contacting on said first semiconductor region;
   forming a groove which extends from a surface of said second semiconductor region spaced from said first semiconductor region to the vicinity of a surface of said first semiconductor region abutting said second semiconductor region;
   filling said groove with polycrystalline conductive material;
   forming a third monocrystalline semiconductor region with high impurity concentration of second conductivity type so as to connect a bottom of said groove with the surface of said first semiconductor region;

forming an electrode connected to said conductive material, whereby said conductive material charged in said groove and said third semiconductor region are used as low resistance current paths from said electrode to said first semiconductor region; and said third semiconductor region is formed so as to abut said second semiconductor region and further comprising a step of forming an isolating groove for element isolation of said first and second semiconductor regions in an insular form with said groove filled with conductive material and a step of filling said isolation groove with isolating material.

7. A method of fabricating a semiconductor device comprising the steps of:

selectively forming a first monocrystalline semiconductor region with high impurity concentration of second conductivity type in a monocrystalline semiconductor substrate of first conductivity type;

insularly forming a second monocrystalline semiconductor region with low impuritiy concentration of second conductivity type contacting on said first semiconductor region;

forming a first groove which extends from a surface of said second semiconductor region spaced from said first semiconductor to the vicinity of a surface of said first semiconductor region abutting said second semiconductor region;

forming a second groove for element isolation of said first and second semiconductor regions in an insular form and filling said second groove with isolating material;

filling said first groove with polycrystalline conductive material; p1 forming a third monocrystalline semiconductor region with high impurity concentration of second conductivity type so as to connect a bottom of said first groove with the surface of said first semiconductor region;

forming an electrode connected to said conductive material;

whereby said conductive material charged in said first groove and said third semiconductor region are used as low resistance current paths from said electrode to said first semiconductor region; and said first groove filled with conductive material being formed in contact with a wall of said second groove for element isolation, whereby said first and second grooves are formed in a side-by-side relationship, and said third semiconductor region being formed so as to abut said second semiconductor region.

8. A method of fabricating a semiconductor device comprising the steps of:

selectively forming a first monocrystalline semiconductor region with high impurity concentration of second conductivity type in a monocrystalline semiconductor substrate of first conductivity type;

insularly forming a second monocrystalline semiconductor region with low impurity concentration of second conductivity type contacting on said first semiconductor region;

forming a first groove which extends from a surface of said second semiconductor region spaced from said first semiconductor region up to the vicinity of a surface of said first semiconductor region abutting said second semiconductor region;

filling said first groove with polycrystalline conductive material to connect a bottom of said first groove with the surface of said first semiconductor region;

forming a third monocrystalline semiconductor region with high impurity concentration of second conductivity so as to connect the bottom of said first groove with the surface of said first semiconductor region;

forming an electrode connected to said conductive material, whereby said conductive material charged in said first groove is used as a low resistance current path from said electrode to said first semiconductor region; and said third semiconductor region being formed so as to abut said second semiconductor region, and further comprising a step of forming a second groove for element isolation of said first and second semiconductor regions in an insular form with said groove filled with conductive material and a step of filling said second groove with isolating material.

9. The method of fabricating a semiconductor device of claim 8, wherein said bottom of said groove is formed so as to be spaced from said first semiconductor region and said first semiconductor region and the low resistance current path are used as sub-collector and collector current paths, respectively, of a vertical NPN bipolar transistor.

10. The method of fabricating a semiconductor device of claim 8, wherein said first and second semiconductor regions comprise a well of a CMOS transistor, and said third semiconductor region abuts said second semiconductor region.

11. A method of fabricating a semiconductor device comprising the steps of:

selectively forming a first monocrystalline semiconductor region with high impurity concentration of second conductivity type in a monocrystalline semiconductor substrate of first conductivity type;

insularly forming a second monocrystalline semiconductor region with low impurity concentration of second conductivity type contacting on said first semiconductor region;

forming a groove which extends from a surface of said second semiconductor region spaced from said first semiconductor region to the vicinity of a surface of said first semiconductor region abutting said second semiconductor region;

filling said groove with polycrystalline conductive material;

forming a third monocrystalline semiconductor region with high impurity concentration of second conductivity type so as to connect a bottom of said groove with the surface of said first semiconductor region;

forming an electrode connected to said conductive material, whereby said conductive material charged in said groove and said third semiconductor region are used as low resistance current paths from said electrode to said first semiconductor region; and said bottom of said groove being formed so as to be spaced from said first semiconductor region and further comprising a step of disposing an insulating film on the side wall of said groove filled with conductive material.

12. A method of fabricating a semiconductor device comprising the steps of:

selectively forming a first monocrystalline semiconductor region with high impurity concentration of second conductivity type in a monocrystalline semiconductor substrate of first conductivity type;

insularly forming a second monocrystalline semiconductor region with low impurity concentration of second conductivity type contacting on said first semiconductor region;

forming a groove which extends from a surface of said second semiconductor region spaced from said first semiconductor region to the vicinity of a surface of said first semiconductor region abutting said second semiconductor region;

filling said groove with polycrystalline conductive material;

forming a third monocrystalline semiconductor region with high impurity concentration of second conductivity type so as to connect a bottom of said groove with the surface of said first semiconductor region;

forming an electrode connected to said conductive material, whereby said conductive material charged in said groove and said third semiconductor region are used as low resistance current paths from said electrode to said first semiconductor region; and said third semiconductor region of second conductivity type being formed by heat treatment using the conductive material as the diffusion source of impurities, and said third semiconductor region is formed so as to abut said second semiconductor region.

13. A method of fabricating a semiconductor device comprising the steps of:

selectively forming a first monocrystalline semiconductor region with high impurity concentration of second conductivity type in a monocrystalline semiconductor substrate of first conductivity type;

insularly forming a second monocrystalline semiconductor region with low impurity concentration of second conductivity type contacting on said first semiconductor region;

forming a first groove which extends from a surface of said second semiconductor region spaced from said first semiconductor region up to the vicinity of a surface of said first semiconductor region abutting said second semiconductor region;

filling said first groove with polycrystalline conductive material to connect a bottom of said first groove with the surface of said first semiconductor region;

forming a third monocrystalline semiconductor region with high impurity concentration of second conductivity type so as to connect a bottom of said groove with the surface of said first semiconductor region; and forming an electrode connected to said conductive material, said conductive material in said first groove being a low resistance current path from said electrode to said first semiconductor region, said first and second semiconductor regions comprising a well of a CMOS transistor, and said third semiconductor region abuts said second semiconductor region.

* * * * *